United States Patent [19]
Hwang

[11] Patent Number: 5,395,780
[45] Date of Patent: Mar. 7, 1995

[54] PROCESS FOR FABRICATING MOS TRANSISTOR

[75] Inventor: Hyun S. Hwang, Seoul, Rep. of Korea

[73] Assignee: Goldstar Electron Co., Ltd., Rep. of Korea

[21] Appl. No.: 135,262

[22] Filed: Oct. 12, 1993

[51] Int. Cl.⁶ .......................................... H01L 21/265
[52] U.S. Cl. ...................................... 437/44; 437/40; 437/45
[58] Field of Search ....................... 437/40, 41, 44, 45, 437/46; 148/DIG. 35

[56] References Cited

U.S. PATENT DOCUMENTS

| | | | |
|---|---|---|---|
| 4,948,744 | 8/1990 | Kita | 437/44 |
| 5,082,794 | 1/1992 | Pfiester et al. | 437/40 |
| 5,141,895 | 8/1992 | Pfiester et al. | 148/DIG. 35 |
| 5,304,504 | 4/1994 | Wei et al. | 437/44 |

OTHER PUBLICATIONS

"Novel Shallow Counter Doping Process and High Performance Buried Channel pMOSFET Using Boron Diffusion Through Oxide" by Y. Toyoshima, et al., Semiconductor Device Engineering Laboratory, Toshiba Corporation; May 1, 1992; pp. 111–112.

Primary Examiner—Brian E. Hearn
Assistant Examiner—Kevin M. Picardat
Attorney, Agent, or Firm—Poms, Smith, Lande & Rose

[57] ABSTRACT

A process for the fabrication of an MOS transistor.

The process comprises the steps of forming a gate oxide film on a substrate, forming a p+ polysilicon film doped with p type impurity ions over said gate oxide film, coating an insulating film and a photoresist film over said p+ polysilicon film, in sequence, subjecting the resultant structure to a patterning to expose a portion of said insulating film, applying an etching method to said exposed insulating film with said photoresist film used as a mask, implanting fluorine ions in said p+ polysilicon film with resultant insulating film used as a mask, removing the remaining photoresist film, carrying out an annealing method to form a low density p⁻ source/drain regions, applying an etching method to said p+ polysilicon film to form a gate with said resultant insulating film used as a mask, removing said resultant insulating film, depositing an oxide film entirely over the resultant structure, applying an anisotropic etching to said oxide film to form spacers at side walls of said gate, implanting p type impurity ions in said substrate at a high density to form high density p+ source/drain regions neighboring said low density p⁻ source/drain regions, thereby the device having a storage capacity of not less than 256M can be fabricated more reliably and more advantageously.

9 Claims, 3 Drawing Sheets

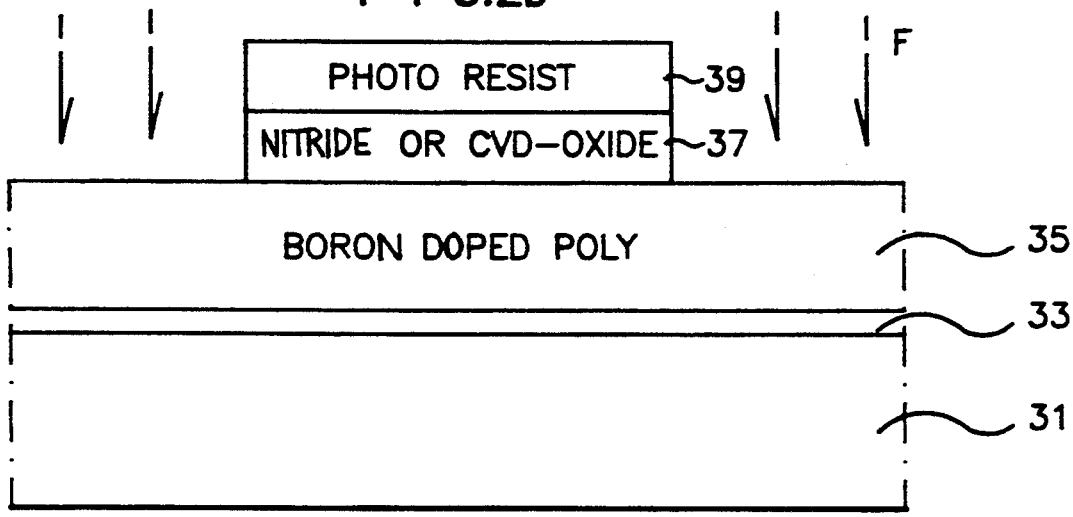
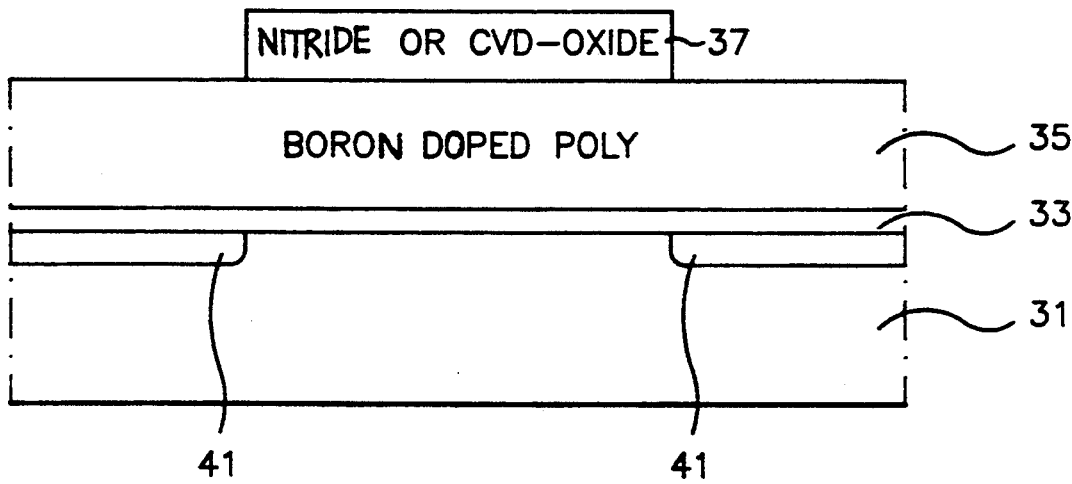
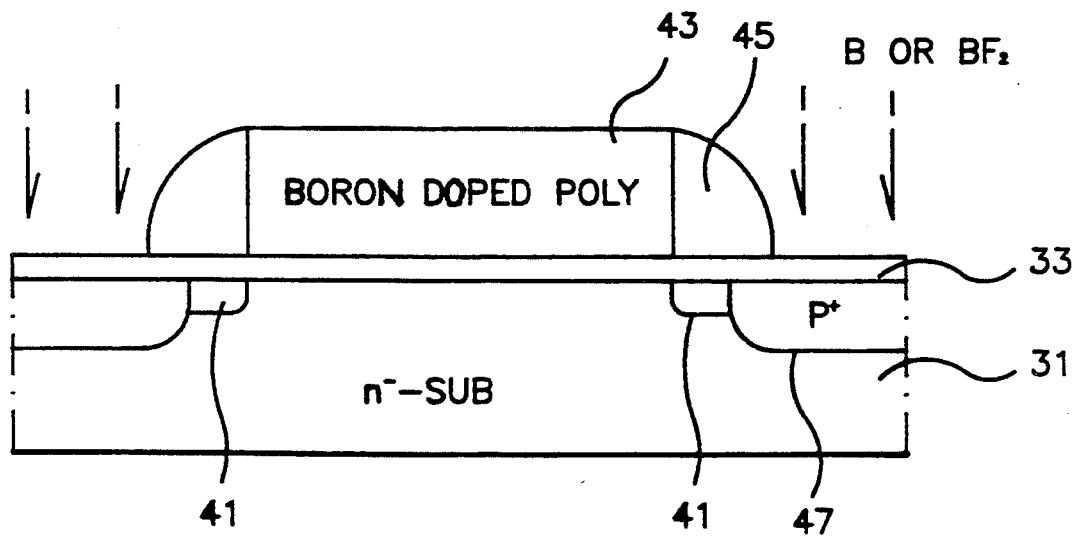

F I G.3
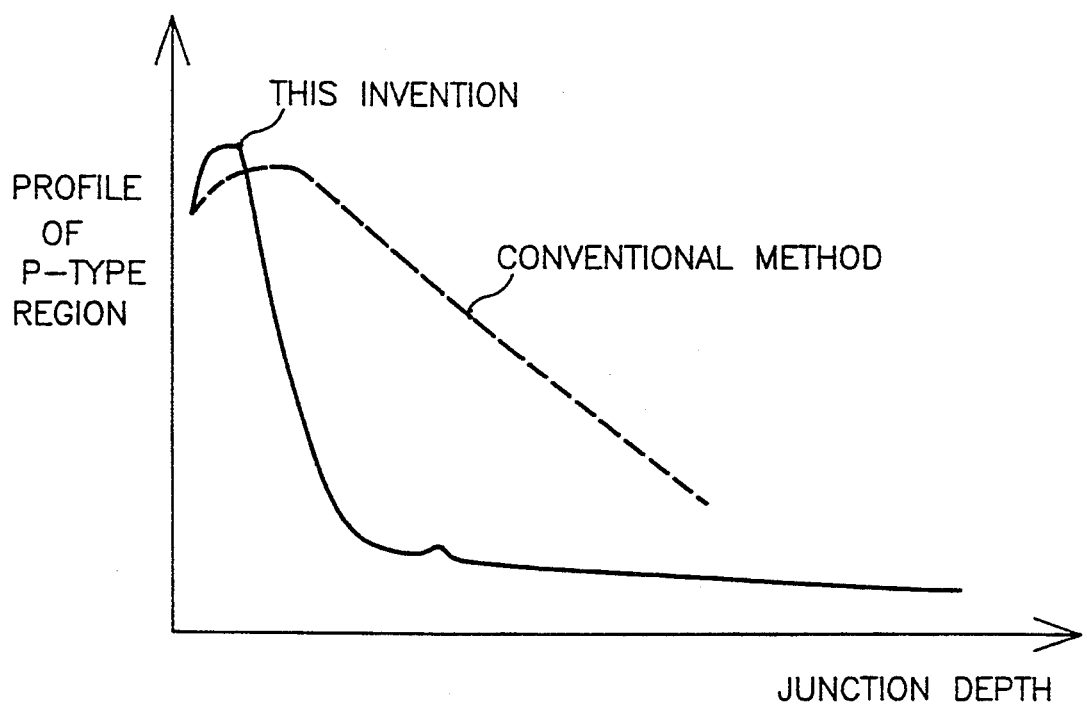
F I G.4
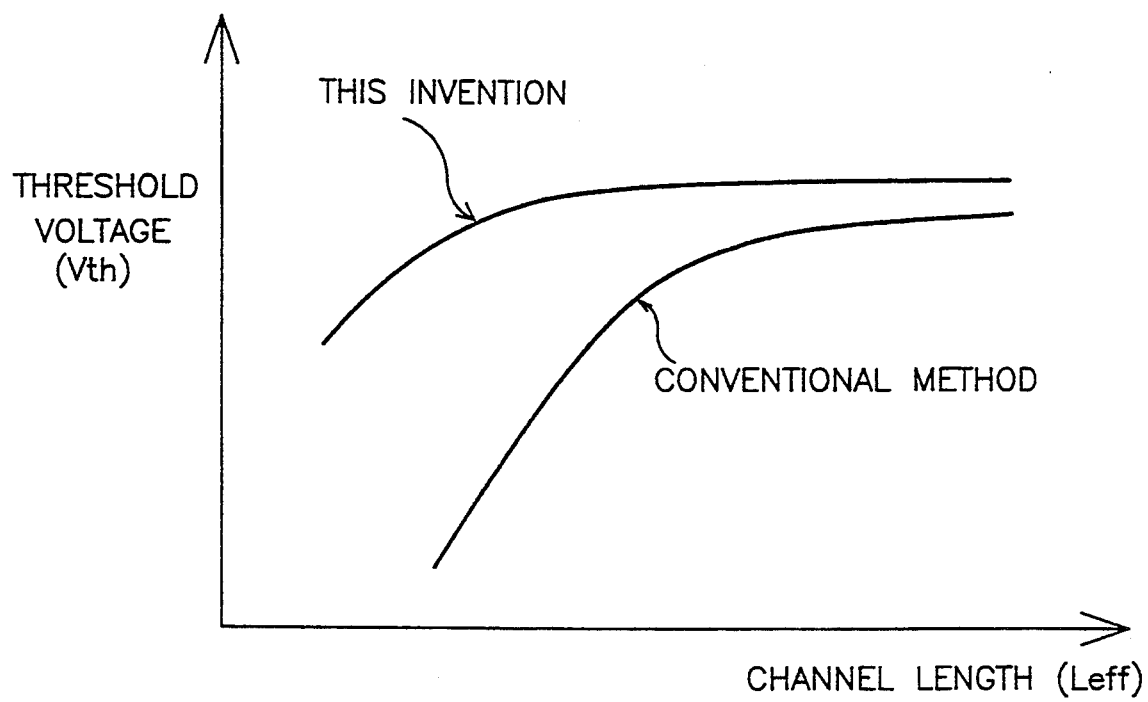

PROCESS FOR FABRICATING MOS TRANSISTOR

BACKGROUND OF THE INVENTION

1. Field of the Invention

The present invention relates in general to a process for fabricating an MOS transistor, and more particularly to improvement in a short channel effect and a hot carrier effect and a threshold voltage in the MOS transistor.

2. Description of the Prior Art

In a conventional p type MOS transistor, at edge portions of a gate electrode occurs a high electric field, which forces hot carriers to be generated. The generated hot carriers are often trapped in a gate insulating film in the transistor, causing a charge trap or interface state to occur in the insulating gate. These hot carriers serve to degrade an operation characteristic of a p type MOS transistor fabricated and reduce the use life expectancy thereof.

In an effort to curtail the hot carrier effect, a p type MOS transistor having a lightly doped drain (hereinafter "LDD") structure has been proposed. This p type MOS transistor of LDD structure will be explained by referring to FIG. 1 for better understanding of the background of the invention. There is shown a step diagram for the conventional process flow of the p type MOS transistor of LDD structure.

As shown in FIG. 1, in step A, a gate oxide film 13 is formed over an n type semiconductor substrate 11. A p+ type polycrystalline silicon (polysilicon) film doped with p type impurity ions is entirely formed on the gate oxide film 13 and is then subjected to a patterning so as to form a gate 15. Using the gate 15 as a mask, p type impurity ions such as B ions and $BF_2$ ions are implanted at such a low density as to form source/drain regions having a low p− density.

Subsequently, in step B, the fabrication of the p type MOS transistor of LDD structure is finished. For this, firstly, an oxide film is deposited entirely on the substrate and is then subjected to the treatment of anisotropic etching so as to form spacers 19 at side sites of the gate 15, leaving them shaped into side walls, respectively, as shown in the figure. Next, using the spacers 19 and the gate 15 as a mask, p type impurity ions such as B ions or $BF_2$ ions are implanted in the substrate 11 at such a high density as to form source/drain regions 21 having a high p+ density.

In the above MOS transistor of LDD structure, the drain region 17 having a low p− density allows the high electric field applied to the drain region to become lowered, so that the degradation of operation characteristics in the device caused by the hot carriers can be prevented, thereby improving the reliability of the device.

In case of fabricating a very small LDD MOS transistor for a device having a storage capacity of 256M or more, the p− source/drain regions which have a function of eliminating the hot carrier effect must have a shallow junction depth, for example, several hundreds Å such that a short channel effect is not affected.

However, the conventional process utilizing ion implantation method finds difficulty in producing an LDD MOS transistor having a storage capacity of 256M or more. Hereinafter, this problem will be briefly discussed for better understanding. As mentioned above, as a p type impurity used for forming p type source/drain regions, B or $BF_2$ is employed. Since boron (B) ions have so great diffusivity, the low density p− source/drain regions having a shallow junction are hard to form by the application of ion implantation process. Accordingly, the short channel effect of the device is reversely affected.

SUMMARY OF THE INVENTION

For solving the problem stated above, the presents inventors have recognized that there exists a need for a production process of an LDD MOS transistor, that is capable of forming low density p− source/drain regions having a shallow junction, whereby the LDD MOS transistor demonstrates an excellent effect of short channel and is greatly improved in reliability.

Accordingly, in an aspect of the present invention, there is provided a process for producing an MOS transistor, capable of forming the low density p− source/drain regions therein easily.

According to another aspect of the present invention, there is provided a process for producing an MOS transistor, capable of allowing the transistor to have an improved effect of short channel.

According to a further aspect of the present invention, there is provided a process for producing an MOS transistor, capable of endowing the MOS transistor with reliability.

The above objects can be accomplished by providing a process for the production of MOS transistor, which comprises the steps of forming a gate oxide film on a substrate, forming a $p_+$ polysilicon film doped with p type impurity ions over said gate oxide film, coating an insulating film and a photoresist film over said p+ polysilicon film, in sequence, subjecting the resultant structure to a patterning to expose a portion of said insulating film, applying an etching method to said exposed insulating film with said photoresist film used as a mask, implanting fluorine ions in said p+ polysilicon film with resultant insulating film used as a mask, removing the remaining photoresist film, carrying out an annealing method to form a low density p− source/drain regions, applying an etching method to said p+ polysilicon film to form a gate with said resultant insulating film used as a mask, removing said resultant insulating film, depositing an oxide film entirely over the resultant structure, applying an anisotropic etching to said oxide film to form spacers at side walls of said gate, implanting p type impurity ions in said substrate at a high density to form high density p+ source/drain regions neighboring said low density p− source/drain regions.

The above and other objects and advantages of the present invention will become more apparent as the following description proceeds.

To the accomplishment of the foregoing and related ends, the invention, then, comprises the features hereinafter fully described in the specification and particularly pointed out in claims, the following description and the annexed drawing setting forth in detail a certain illustrative embodiment of the invention, this being indicative, however, of but one of the various ways in which the principles of the invention may be employed.

BRIEF DESCRIPTION OF THE DRAWINGS

In the annexed drawing:

FIGS. 2a-2d are a step diagram showing a process of fabricating an LDD MOS transistor according to the present invention;

FIG. 3 shows doping profiles of low density p− impurity regions with regard to a step diagram in a conventional and a inventive LDD MOS transistors; and FIG. 4 is a graph showing the relation between a channel length and a threshold voltage.

DETAILED DESCRIPTION OF THE PREFERRED EMBODIMENTS

Figure 1A:
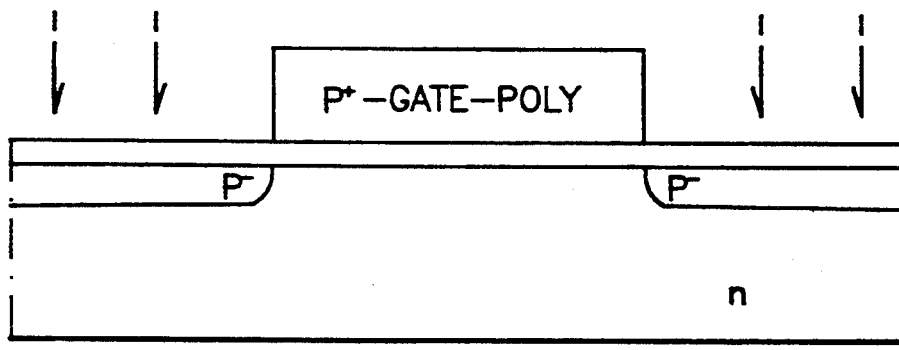
FIGS. 1a–1b are a step diagram showing a conventional process of fabricating an LDD MOD transistor.
Figure 1B:
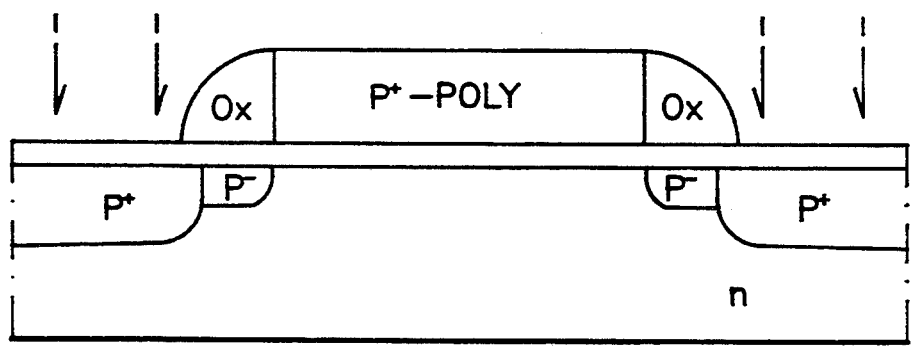
Figure 2A:
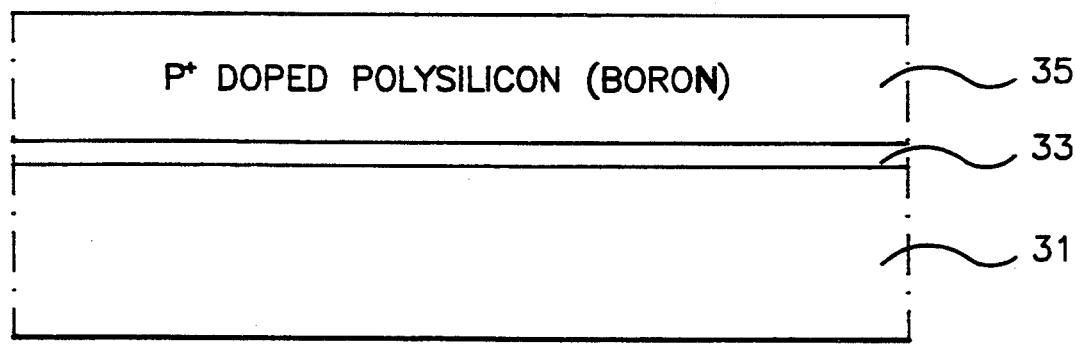

Hereinafter, preferred embodiments of the invention will be described in detail with reference to the drawings, and initially to FIG. 2, there is shown a process for the fabrication of p type LDD MOS transistor according to the present invention, represented with sectional views in due order. Firstly, in step A, the p type LDD MOS transistor is formed of an n type semiconductor substrate 31 on which a gate oxide film 33 is formed into a thickness of not more than 100 Å. Thereafter, over the thin gate oxide film 33, p+ polysilicon film 35 doped with boron is formed, which is to be served as a diffusion source for the forming of low density p− source/drains. The formation of the p+ polysilicon film 35 doped with boron is accomplished by depositing a polysilicon layer on the gate oxide film 33 and then subjecting the polysilicon layer to a doping process with boron. Alternatively, the p+ polysilicon film 35 doped with boron may be formed, employing n+ polysilicon film. For example, an n+ polysilicon film is formed over the gate insulating film 35, followed by doping the n+ polysilicon film with a quantity of BF$_2$ such as to offset and surmount the n+ type impurity ions doped in the n+ polysilicon film.

Subsequently, in step B, description is given up to ion implantation of fluorine impurity ions in the p+ polysilicon film 35. For this, the surface of the p+ polysilicon film 35 is coated with an insulating film 37, followed by the coating of a photoresist film 39 over the insulating film 37. This insulating film 37 covered with the photoresist film 39 is then subjected to the treatment of patterning to partly expose the insulating film 37. A nitride film or a CVD oxide film may be employed for the insulating film. Using the insulating film as a mask, the exposed insulating film 37 is removed. At this time, the remaining part of the insulating film 37 is the site that a gate is to be formed in late step. The insulating film 37 serves also as a mask with fluorine ions implanted into the p+ polysilicon film 35. The dose of the fluorine ions is approximately twice as much as that of the boron ions implanted into the p+ polysilicon film 35.

Step C is undertaken to carry out forming source/drain regions that have a low p− density. For the sake of forming the low density p− source/drain regions, the photoresist film 39 of which only a portion remains along with the insulating gate film 37 after the above removing process is removed and then, an annealing process is applied to the resultant structure. The annealing process forces the boron ions implanted into the p+ polysilicon film 35 to diffuse into the substrate 31 through the gate oxide film 33. As a result, low density p− source/drain regions 41 are formed. On applying the annealing process, the fluorine ions implanted into the p+ polysilicon film 35 promote the boron ions to diffuse from the p+ polysilicon film 35 into the substrate 31 through the gate oxide film 33. By employing a gate oxide film in place of an ion implantation method, a conventional method, the junction depth of the low density p− source/drain regions is not more than 500 Å.

Lastly in step D, the p+ polysilicon film 35 is subjected to a patterning with the insulating film 37 used as a mask, so as to form a gate 43. Thereafter, the insulating film 37 is removed and an oxide film is deposited entirely over the resultant structure. Following this, the deposited oxide film is subjected to the treatment of anisotropic etching so as to spacers 45 at side walls of the gate 43. Using the spacers 45 and gate 43 as a mask, a p type impurity such as B and BF$_2$ is implanted in the substrate 31 so as to form source/drain regions 47 having a high density of p+.

The various inventive features will be described hereinafter in comparison with the LDD MOS transistor according to the conventional process.

Referring initially to FIG. 3, there are doping profiles in the p− impurity regions with regard to the junction depths. As shown in the FIG. 3, low density p− source/drain regions having a more shallow junction depth are formed in a substrate according to the present invention. This can be achieved by employing an oxide film and fluorine ions and applying annealing process, in place of using an ion implantation process, a conventional process, since the boron ions diffuse into the substrate via the oxide film and fluorine ions doped in the same film layer that the boron ions doped promote the diffusion of the boron ions.

Turning now to FIG. 4, there is the relation between a channel length and a threshold voltage. As illustrated in the figure, it is obvious that the LDD MOS transistor according to the process of the invention is superior to conventional one in threshold voltage, as well.

As explained hereinbefore, the application of impurity ions diffusing process through an oxide film and the use of fluorine ions according to the present invention enable the low density source/drain regions to have a very shallow junction which induces the improvements in the short channel effect and the threshold voltage, thereby the device having a storage capacity of not less than 256M can be fabricated more reliably and more advantageously.

What is claimed is:

1. A process for the fabrication of MOS transistor, comprising the steps of:

forming a gate oxide film on a substrate;

forming a p+ polysilicon film doped with p type impurity ions over said gate oxide film;

coating an insulating film and a photoresist film over said p+ polysilicon film, in sequence;

subjecting the resultant structure to a patterning to expose a portion of said insulating film;

applying an etching method to said exposed insulating film with said photoresist film used as a mask;

implanting fluorine ions in said p− polysilicon film with resultant insulating film used as a mask;

removing the remaining photoresist film;

carrying out an annealing method to form low density p− source/drain regions;

applying an etching method to said p+ polysilicon film to form a gate with said resultant insulating film used as a mask;

removing said resultant insulating film;

depositing an oxide film entirely over the resultant structure;

applying an anisotropic etching to said oxide film to form spacers at side walls of said gate;

implanting p type impurity ions in said substrate at a high density to form high density p+ source/drain regions neighboring said low density p− source/drain regions.

2. A process according to claim 1, wherein said p+ polysilicon film acts as a diffusion source for the formation of said low density p− source/drain regions.

3. A process according to claim 2, wherein said step of forming said p+ polysilicon film comprises the steps of:

depositing a polysilicon film on said gate oxide film; and doping said polysilicon film with p type impurity ions.

4. A process according to claim 3, wherein said doped impurity ions are boron ions.

5. A process according to claim 2, wherein said step of forming said p+ polysilicon film comprises the steps of:

coating said gate oxide film with n+ polysilicon film; and doping said n+ polysilicon film with $BF_2$ ions in such an amount that the $BF_2$ ions offset and surmount the n+ type impurity ions doped in said n+ polysilicon film.

6. A process according to claim 1, wherein said insulating film is selected from a nitride film or a CVD oxide film.

7. A process according to claim 1, wherein said p− source/drain regions gate is formed by the diffusion of said p type impurity ions doped in said p+ polysilicon film into said substrate through said gate oxide film when said annealing method is carried out.

8. A process according to claim 7, wherein said low density p− source/drain regions have a junction depth of not more than 500 Å.

9. A process according to claim 1, wherein said fluorine ions are implanted at a dose of the twice amount of said p type impurity ions doped in said p+ polysilicon film.

* * * * *